United States Patent
Lee et al.

(10) Patent No.: US 7,982,982 B2
(45) Date of Patent: Jul. 19, 2011

(54) WAFER LEVEL PACKAGING IMAGE SENSOR MODULE HAVING LENS ACTUATOR AND METHOD OF MANUFACTURING THE SAME

(75) Inventors: Seung Seoup Lee, Gyunggi-do (KR); Sung Yi, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 264 days.

(21) Appl. No.: 12/320,121

(22) Filed: Jan. 16, 2009

(65) Prior Publication Data
US 2010/0084726 A1    Apr. 8, 2010

(30) Foreign Application Priority Data
Oct. 2, 2008   (KR) .................. 10-2008-0097308

(51) Int. Cl.
*G02B 7/04* (2006.01)
(52) U.S. Cl. ...... 359/824; 438/64; 438/65; 257/E31.127
(58) Field of Classification Search .......... 257/98, 257/E31.127, E31.11; 438/57, 64, 65; 359/824
See application file for complete search history.

(56) References Cited

U.S. PATENT DOCUMENTS

| 2006/0028743 A1* | 2/2006 | Yamashita et al. ........... 359/824 |
| 2008/0054155 A1 | 3/2008 | Klein |
| 2008/0204909 A1* | 8/2008 | Shiota et al. ................. 359/824 |

FOREIGN PATENT DOCUMENTS
JP   2006309112 A   * 11/2006

OTHER PUBLICATIONS

Korean Office Action dated Jul. 26, 2010 in corresponding Korean Patent Application.

* cited by examiner

*Primary Examiner* — Victor A Mandala
*Assistant Examiner* — Scott Stowe

(57) ABSTRACT

Disclosed herein is a wafer level packaging image sensor module, including a wafer including an image sensor, a circuit portion and a lower electrode on one side thereof, a lens actuator disposed on the lower electrode and made of electroactive polymer, an upper electrode disposed on the lens actuator, and a lens unit disposed on the upper electrode to allow light to be transmitted to the image sensor therethrough. The wafer level packaging image sensor module includes the lens actuator made of electroactive polymer, and thus it enables realization of the autofocusing of the wafer level packaging image sensor module.

4 Claims, 5 Drawing Sheets

(a)

(b)

WAFER LEVEL PACKAGING IMAGE SENSOR MODULE HAVING LENS ACTUATOR AND METHOD OF MANUFACTURING THE SAME

CROSS REFERENCE TO RELATED APPLICATION

This application claims the benefit of Korean Patent Application No. 10-2008-0097308, filed Oct. 2, 2008, entitled "WAFER LEVEL PACKAGING IMAGE SENSOR MODULE HAVING A LENS ACTUATOR AND THE METHOD OF MANUFACTURING THE SAME", which is hereby incorporated for reference in its entirety into this application.

BACKGROUND OF THE INVENTION

1. Field of the Invention

The present invention relates to a wafer level packaging image sensor module and a method of manufacturing the same, and more particularly to a wafer level packaging image sensor module having a lens actuator which is composed of electroactive polymer and thus enables autofocusing and a method of manufacturing the same.

2. Description of the Related Art

Recently, as most pieces of portable mobile communication terminal equipment are provided with high-performance cameras of megapixel resolution, sales of mobile phones equipped with cameras has rapidly increased, and consumer's demands for moving images as well as still images of high image quality and high resolution has increasingly become keener.

In order to fulfill these demands, multifunctional mobile phones, which can execute autofocusing, closeup and optical zoom functions as well as the inherent shooting of a camera incorporated in the mobile phone, are being developed. In addition, modules of the cameras are becoming increasingly miniaturized. However, it is hard to satisfy various consumer's demands by developing mobile phone products incorporating therein autofocusing devices fabricated in a conventional manner of driving lenses.

Furthermore, since the conventional autofocusing device is constructed of a DC motor and a plurality of final reduction gears, its volume increases and drive noise of the motor is generated. In addition to these problems, since it is difficult to fulfill controlling of position due to extended starting time and stopping time during activation of the DC motor, transferring efficiency of a lens assembly is drastically decreased.

Meanwhile, because of the necessity of an increased number of pixels of camera modules and because of the necessity of miniaturization and high density packaging of camera modules required for the application to mobile phones, a wafer level camera module (WLCM) is being proposed. The wafer level camera module refers to a camera module, which is manufactured by producing an image sensor and a lens using a wafer level technology, so that it can be suitable for mass production and can be directly mounted on a main substrate of a mobile phone.

In the manufacture of the wafer level camera module, a wafer to wafer process is configured in a way such that a lens wafer is bonded in a bonding manner to a wafer equipped with an image sensor and is then subjected to a singulation process, thus manufacturing a camera module.

FIG. 1 shows a wafer level image sensor module which is manufactured using the above-described process. As shown in FIG. 1, after a lens wafer 7 is once bonded to a wafer 1 equipped with an image sensor 3 and electrode pads 5, control of focusing length is restricted because there is a measure of controlling a distance therebetween. Although an additional spacer is disposed between the lens wafer 7 and the wafer 1 including the image sensor mounted thereon for control of focusing length of the lens, there is considerable difficulty in precisely adjusting focusing length of a nonadjustable image sensor module.

SUMMARY OF THE INVENTION

Accordingly, the present invention has been made keeping in mind the above problems occurring in the prior art, and the present invention provides a wafer level packaging image sensor module which is adapted to enable autofocusing.

In one aspect, the present invention provides a wafer level packaging image sensor module, including: a wafer including an image sensor, a circuit portion and a lower electrode on one side thereof; a lens actuator disposed on the lower electrode and made of electroactive polymer; an upper electrode disposed on the lens actuator; and a lens unit disposed on the upper electrode to allow light to be transmitted to the image sensor therethrough.

The wafer level packaging image sensor module may further include an adhesive layer disposed between the upper electrode and the lens unit.

The electroactive polymer may include a dielectric elastomer.

The lens actuator may be tapered on one side thereof and the wafer level packaging image sensor module may include an upper wiring pattern formed on the one tapered side.

The circuit portion may be electrically connected to the upper electrode and the lower electrode so as to control a voltage applied to the upper and lower electrodes in response to signals produced by the image sensor.

In another aspect, the present invention provides a method of manufacturing a wafer level image sensor module, including: preparing a wafer including an image sensor, a circuit portion and a lower electrode on one side thereof; forming a lens actuator made of electroactive polymer on the lower electrode; forming an upper electrode on the lens actuator; and forming a lens unit on the upper electrode to allow light to be transmitted to the image sensor therethrough.

The method may further including, after forming the upper electrode, forming an adhesive layer on the upper electrode.

The preparing the wafer may include: preparing a wafer including the image sensor and the circuit portion on one side thereof; and forming the lower electrode on the wafer.

The forming the lens actuator may include: forming an electroactive polymer layer on the lower electrode; and forming a resist layer on the electroactive polymer layer, patterning the resist layer through a mask and patterning the electroactive polymer layer.

The mask may include a graytone mask.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
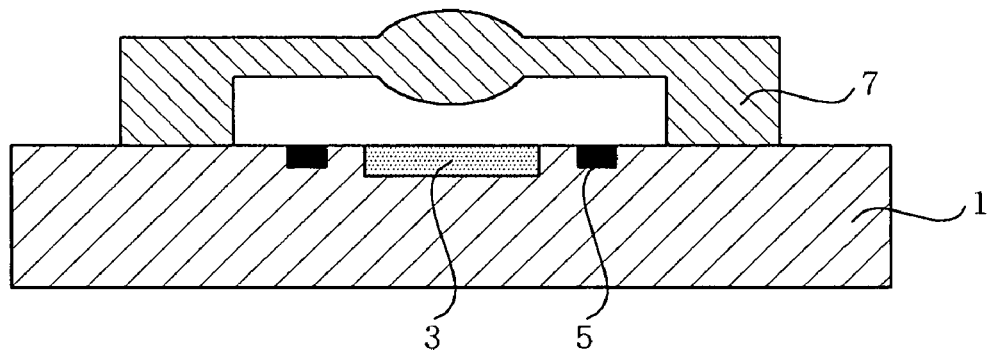
FIG. 1 is a cross-sectional view of a conventional wafer level packaging image sensor module.

Objects, advantages and features of the invention will become apparent from the following description of embodiments with reference to the accompanying drawings. In the detailed description, the terms and words used in the detailed description and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

Hereinafter, a wafer level packaging image sensor module having a lens actuator and a method of manufacturing the module, according to a preferred embodiment of the present invention, will be described in detail with reference to the accompanying drawings. In the accompanying drawings, it should be noted that the same reference numerals are used throughout the different drawings to designate the same or similar components, and redundant detailed descriptions thereof are omitted.

Figure 2A:
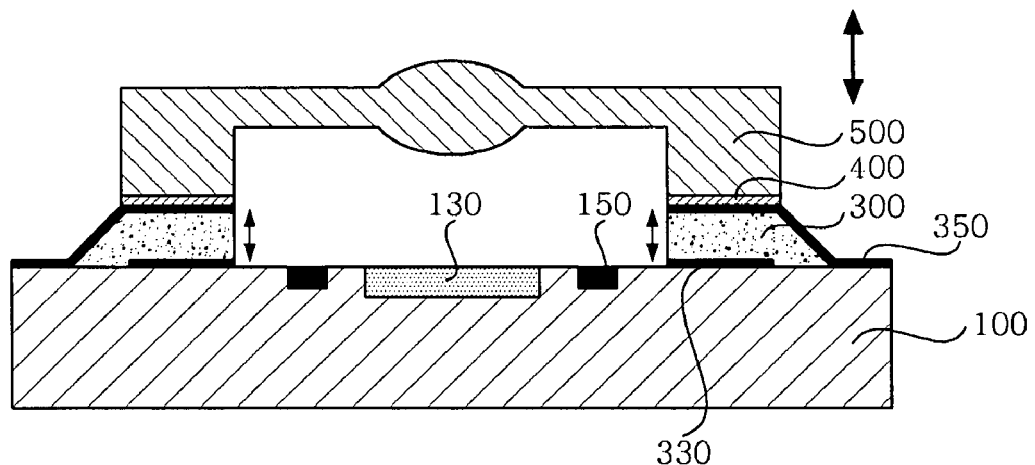
FIG. 2A is a cross-sectional view of a wafer level packaging image sensor module having a lens actuator, according to an embodiment of the present invention.

FIG. 2A is a cross-sectional view of a wafer level packaging image sensor module according to an embodiment of the present invention.

As shown in FIG. 2A, the @ according to this embodiment of the present invention comprises a wafer 100 which includes an image sensor 130, circuit portions 150 and a lower electrode 330 thereon, a lens actuator 300 disposed on the lower electrode 330, and an upper electrode 350 disposed on the lens actuator 300, and a lens unit 500 disposed on the upper electrode to allow light to transmitted to the image sensor 130 therethrough.

The wafer 100 may be composed of silicon or materials containing silicon, and includes the image sensor 130, the circuit portions 150 and the lower electrode 330 thereon.

The image sensor 130, which functions to convert an optical signal into an electrical signal, may be of CCD, CMOS and the like. Although not illustrated in the drawing, the image sensor 130 may include an infrared filter attached to one side thereof. The circuit portions are components for executing various signal processes such as noise removal, amplification and the like for electrical signals output from the image sensor 130. The circuit portions according to this embodiment may be connected to an exterior control circuit so as to fulfill additional functions of controlling the lens actuator 300 in response to an output signal from the image sensor 130.

The lower electrode 330 is formed on the wafer 100, and is adapted to apply driving voltage to the lens actuator in conjunction with the upper electrode 350. The lower electrode 330 may be composed of, for example, conductive metals such as gold, silver, nickel, aluminum and copper.

The lens actuator 300 is adapted to be driven up and down (in a direction of the light axis) by the driving voltage applied from the lower electrode 330 and the upper electrode 350. The lens actuator 300 according to this embodiment may be composed of electroactive polymer (EAP) which allows for expansion and contraction caused by the driving voltage, thus enabling displacement thereof relative to the image sensor. Accordingly, a thickness of the lens actuator 300 may be determined in consideration of a driving range of the lens actuator 300.

Figure 2B:
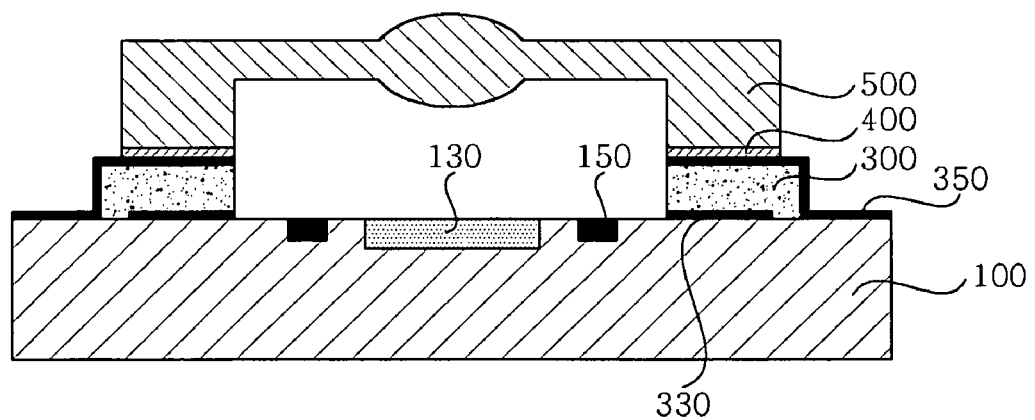
FIG. 2B is a cross-sectional view of a wafer level packaging image sensor module having a lens actuator different from the lens actuator shown in FIG. 2A.

As shown in FIG. 2A, the lens actuator 300 according to this embodiment of the present invention may be configured to have an area larger than the lower electrode 330 and to be tapered on one side thereof, so that a wiring pattern of the lens actuator 300 is connected to the upper electrode 350 which is described later. However, the lens actuator 300 is not limited to this configuration shown in FIG. 2A but may be configured to have a rectangular section as illustrated in FIG. 2B.

In this embodiment, the lens actuator 300 is composed of electroactive polymer, in particular, of dielectric elastomer. Functions and constituent material of the lens actuator 300 according to this embodiment will be described in greater detail later.

The upper electrode 350 is formed on the lens actuator 300, and may be a conductive pattern for applying driving voltage to the lens actuator 300 in conjunction with the lower electrode 330. For example, the upper electrode 350 may be made of conductive metals such as gold, silver, nickel, aluminum and copper. Although not shown in the drawing, the upper electrode 350 may be configured as being divided into an upper electrode part formed on a flat region of the lens actuator 300 and an upper electrode wiring part formed on a circumferential region and a tapered side region of the lens actuator 300. In this case, the upper electrode wiring part may be configured to be thicker and thinner than the upper electrode part so as not to be broken even during the expansion or contraction of the lens actuator 300, and may also be configured to have a curved pattern.

The lens unit 500 is configured to include a lens for converging an image signal of an object. In this embodiment, the lens unit 500 is described as being composed of a single lens and a spacer integral with the lens for imparting a focusing length between the single lens and the image sensor 130. However, the present invention should not be understood to be limited to this configuration, but may include various lens units, such as a lens unit including a lens and a spacer which are constructed as separate components, a lens unit including a plurality of lenses which are sequentially stacked one on another with spacers disposed therebetween and a lens unit including a plurality of lenses which are arranged in a parallel pattern. The lens unit 500 may further include a diaphragm on a front surface thereof to partially intercept incident light. In other words, it is noted that the technical features of the present invention may be applied independently of the concrete construction of the lens unit 500.

For example, the lens unit 500 may be bonded to the lens actuator 300 via an adhesive layer 400. The adhesive layer 400 may be made of, but not limited to, an adhesive material such as a polymer which is bondable at a low temperature.

In this embodiment, the lens actuator 300 may be made of electroactive polymer (EAP). The term "electroactive polymer" refers to a polymer material which can be deformed by electrical stimulation. Furthermore, the electroactive polymer may also include a polymer material which can be driven by chemical stimulation and heat as well as electrical stimulation.

The electroactive polymer may be roughly classified into an ionic EAP and an electronic EAP. The ionic EAP is an actuator which is movable by driving force caused by diffusion of conductive ions, while the electronic EAP is an actuator which is movable by driving force caused by Coulombic forces. More specifically, the ionic EAP may include ionic polymer metal composite (IPMC), conductive polymer, polymer gel (PVDF), carbon nanotube, shape memory polymer and the like, and the electronic EAP may include dielectric elastomer, piezoelectric polymer, electro-strictive polymer and the like. Furthermore, the electroactive polymer may be classified into an electroactive polymer which can be driven by liquid chemical solvent, and an electroactive polymer which can be driven only by electrical energy in the air.

Figure 12:
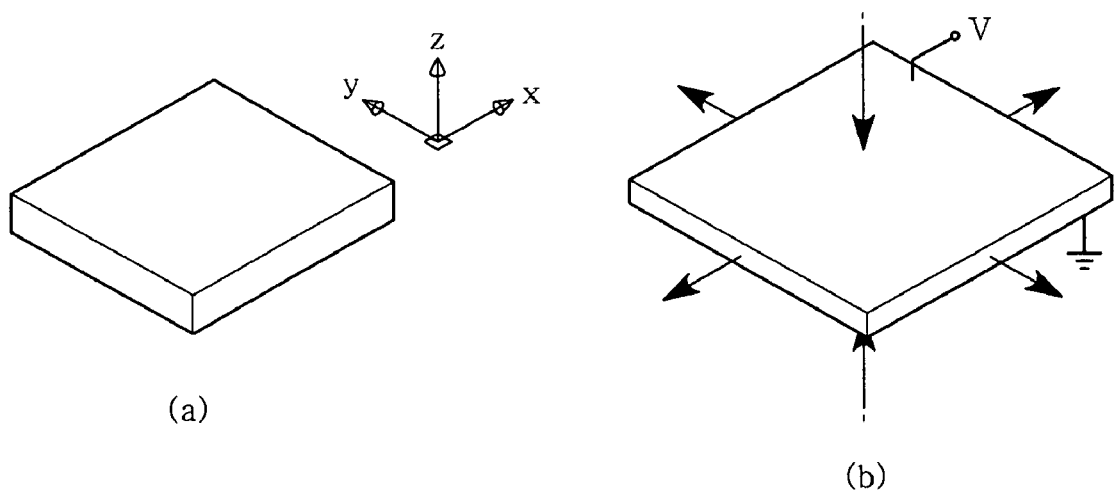
FIG. 12 is a schematic view showing a driving principle of a dielectric elastomer.

In this embodiment, the lens actuator 300 is made of the above-mentioned electronic EAP, in particular, a dielectric elastomer. The dielectric elastomer has advantages in that it can be driven at room temperature in the atmosphere, can have a great deformation ratio and a rapid response speed and can be worked into a thin film. FIG. 12 is a schematic view showing a driving principle of the dielectric elastomer, in which FIG. 12A shows a polymer film type dielectric elastomer to which a voltage is not applied, and FIG. 12B shows the polymer film type dielectric elastomer in which a voltage is applied to electrodes formed on upper and lower sides of the dielectric elastomer and is thus thinned and increased in area. In this embodiment, the dielectric elastomer which has the above-described characteristics is used as the lens actuator 300 of the wafer level packaging image sensor module.

According to this embodiment, the wafer level packaging image sensor module includes the lens actuator 300 composed of electroactive polymer, so that the lens unit 500 can be easily driven in a direction of the light axis by the lens actuator 300 thus controlling a focusing length between the lens and the image sensor 130. Consequently, the autofocusing can be realized in the image sensor module at a wafer level.

Hereinafter, a method of manufacturing a wafer level packaging image sensor module having a lens actuator, according to an embodiment of the present invention, will be described in detail with reference to the accompanying drawings. FIGS. 3 to 10 are cross-sectional views sequentially showing the method of manufacturing a wafer level packaging image sensor module having a lens actuator, according to an embodiment of the present invention.

Figure 3:
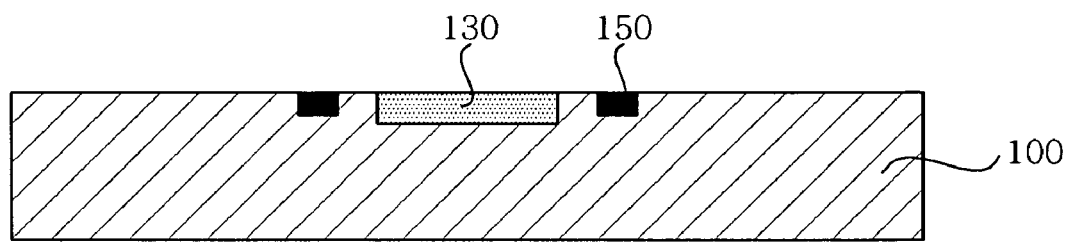
FIGS. 3 to 10 are cross-sectional views sequentially showing the method of manufacturing a wafer level packaging image sensor module having a lens actuator according to an embodiment of the present invention.
Figure 4:
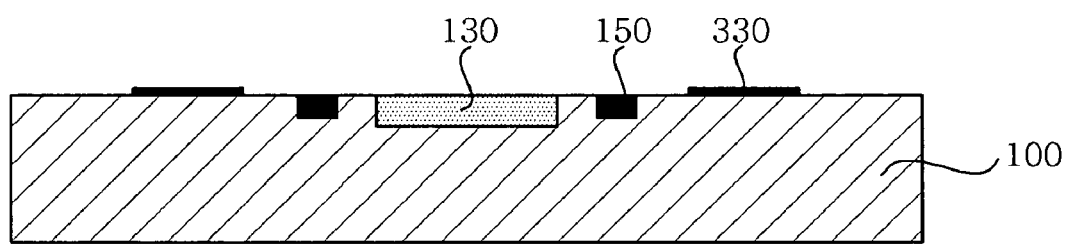

As shown in FIG. 3, a wafer 100 which includes an image sensor 130 and circuit portions 150 on an upper side thereof is first prepared. As shown in FIG. 4, a lower electrode 330 is formed around the image sensor 130 such that the image sensor 130 is centrally positioned. The lower electrode 330 may be formed through, for example, a physical vapor deposition (PVD) process such as sputtering, or a chemical vapor deposition (CVD) process.

Figure 5:
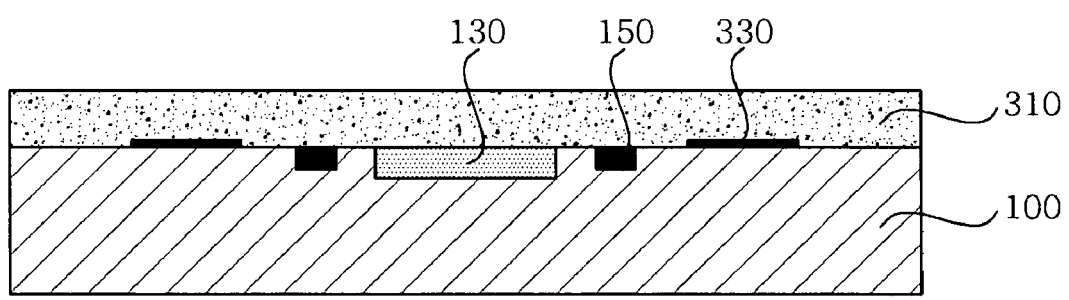

Subsequently, as shown in FIG. 5, an electroactive polymer 310 is applied on an upper surface of the wafer 100. As described above, although various kinds of electroactive polymers may be used in this process, a dielectric elastomer is used in this embodiment.

Figure 6:
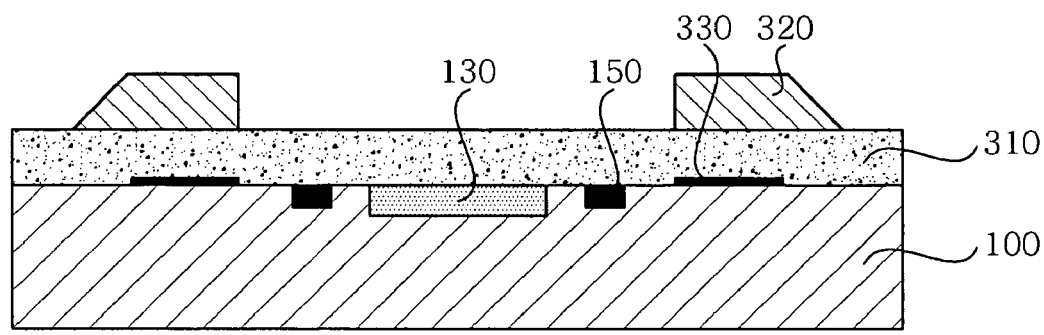

As shown in FIG. 6, a mask is formed on the electroactive polymer 310. At this point, a photoresist layer (not shown) is formed on the electroactive polymer, and then the photoresist layer is exposed to ultraviolet through a graytone mask and is thus patterned into a photoresist 320 configured to be tapered on one side thereof, as shown in the drawing.

Figure 7:
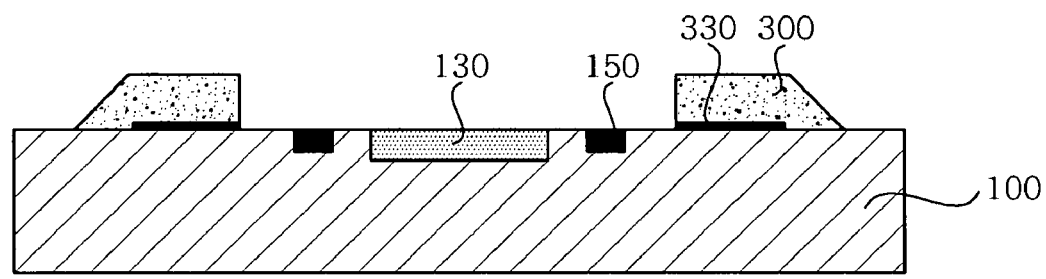

Consecutively, as shown in FIG. 7, the electroactive polymer is patterned. At this point, the electroactive polymer is etched through a reactive ion etching process, with the result that a lens actuator 300, which has a configuration identical to the photoresist patterned in the before process, is formed.

The reactive ion etching, which is a kind of dry etching process, is conducted in a manner such that etching gas is conditioned into a plasma state, and then the plasma gas is brought into collision with the electroactive polymer using the upper and bottom electrode, so that the etching is achieved by a combination of physical impact and chemical reaction.

Figure 8:
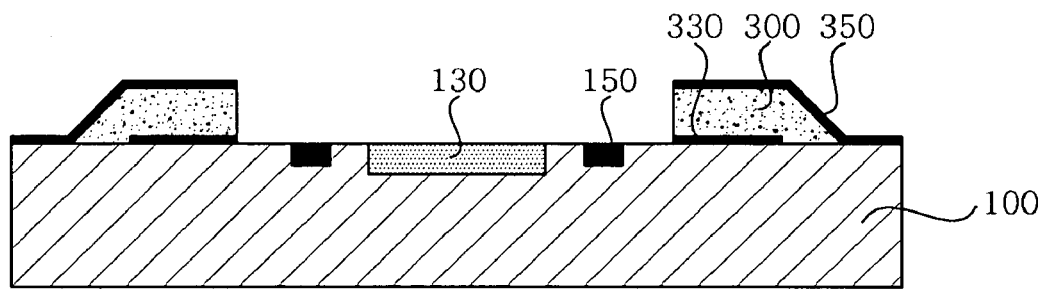

As shown in FIG. 8, an upper electrode 350 is formed on the lens actuator 300. At this point, the upper electrode 350 may be formed through a physical vapor deposition (PVD) process such as sputtering, or a chemical vapor deposition (CVD) process, as in the formation of the lower electrode 330.

Figure 9:
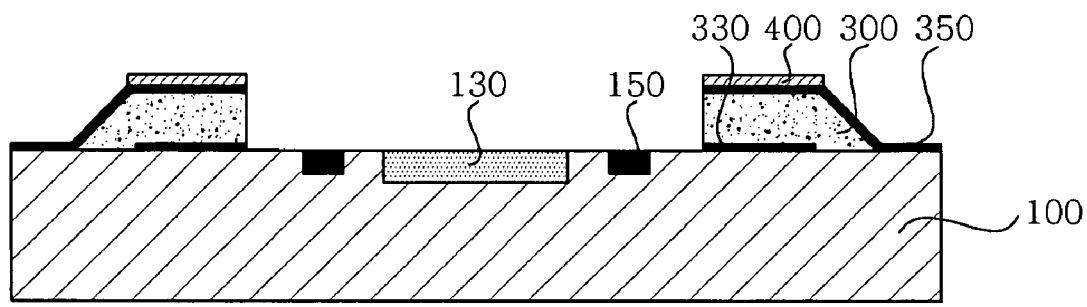

As shown in FIG. 9, an adhesive layer 400 is applied on the upper electrode 350. The adhesive layer 400 may be formed by applying adhesive material such as polymer adhesive which can become bondable at a lower temperature.

Figure 10:
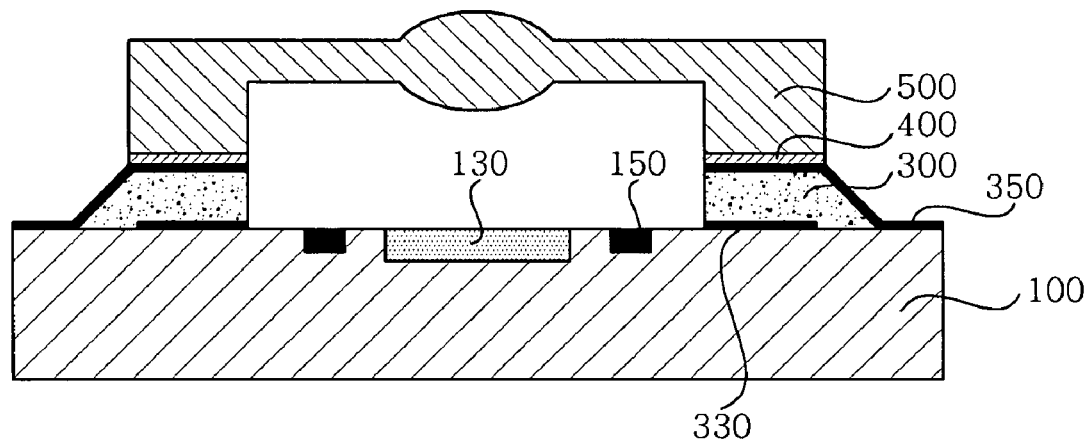

As shown in FIG. 10, a lens unit 500, which allows transmission of light therethrough, is bonded on the adhesive layer 400. The lens unit 500 is configured to include a lens for converging an image signal of an object as previously described. Methods of manufacturing the lens units 500 which have various configurations for fulfilling the converging function are known in the art, and the method of manufacturing the lens unit 500 is not limited to any one way.

For example, the lens unit 500 may be manufactured in a manner such that a photoresist pattern (not shown) is formed on a wafer of acryl, COC or Pyrex glass through a photolithography process, the photoresist pattern is formed into a lens shape through a reflow process, and then the lens unit is formed according to the reflowed photoresist pattern through an etching process and the like.

In the case of a lens unit 500 including lenses on both sides, the lens unit may be manufactured in a manner such that one side of a lens wafer is worked to have a lens thereon, photoresist is applied to the side of the lens wafer on which the lens is formed such that the side of the lens wafer is flattened, and then the other side of the lens wafer is subjected to photolithography, reflow and etching processes, thus forming the other lens.

When the lens unit 500 is completed, the lens unit 500 is bonded to the adhesive layer 400, with the result that the wafer level packaging image sensor module having a lens actuator is manufactured.

Figure 11A:
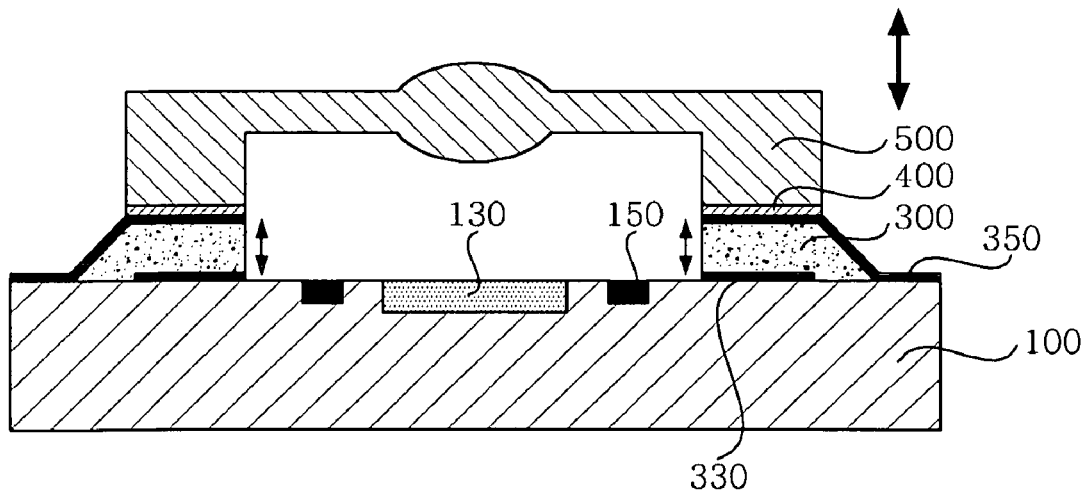
FIGS. 11A and 11B are cross-sectional views showing a mechanism of controlling focusing length in the wafer level packaging image sensor module having a lens actuator according to the embodiment of the present invention.
Figure 11B:
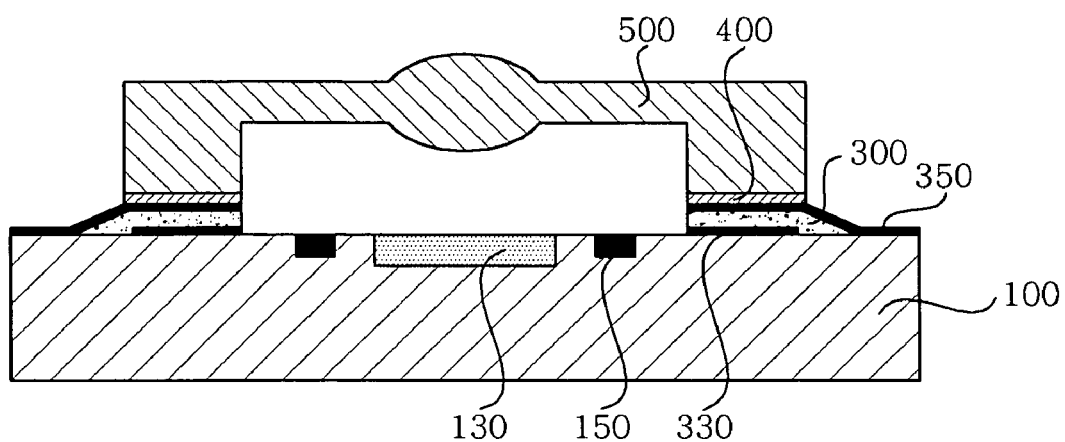

FIGS. 11A and 11B are cross-sectional views showing a mechanism of controlling a focusing length in the wafer level packaging image sensor module having a lens actuator, according to this embodiment of the present invention.

As shown in FIG. 11A, when the lens unit 500 is mounted on the wafer level packaging image sensor, a focusing length between the lens and image sensor 130 is adjusted. At this time, the wafer level packaging image sensor module according to this embodiment enables the lens actuator 300 to be driven up and down, thus simply controlling a focusing length between the lens and the image sensor 130. In other words, the focusing length can be controlled in such a manner as to cause expansion or contraction of the lens actuator 300 by applying a voltage, which has intensity proportional to a desired focusing length, to the upper electrode 350 and the lower electrode 330 of the lens actuator 300.

FIG. 11B is a cross-sectional view showing the wafer level image sensor module as shown in FIG. 11A in which the lens unit 500 is driven downwards by the contraction of the lens actuator 300. As described above, the intensity of the voltage may be determined in response to control signals from the circuit portions 150.

It will be easily understood by those skilled in the art that the focusing length of the wafer level packaging image sensor module can be controlled by changing a voltage applied between the upper electrode 350 and the lower electrode 330.

According to the above-described method of manufacturing a wafer level packaging image module having a lens actuator, by the adoption of electroactive polymer, an image sensor which does not require adjustment of focusing length can be manufactured at low cost, and autofocusing of an image sensor module can be realized in wafer level packaging.

As described above, since the wafer level packaging image sensor module according to the present invention includes a lens actuator made of electroactive polymer, it is possible to realize the autofocusing of the wafer level packaging image sensor module.

In addition, since the focusing of the wafer level packaging image sensor module is controlled using electroactive polymer, an image sensor module which does not require adjustment can be manufactured at low cost.

Although the preferred embodiment of the present invention has been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A method of manufacturing a wafer level image sensor module, comprising:
    preparing a wafer including an image sensor, a circuit portion and a lower electrode on one side thereof;
    forming a lens actuator made of electroactive polymer on the lower electrode, comprising:
        forming an electroactive polymer layer on the lower electrode, and
        forming a resist layer on the electroactive polymer layer, patterning the resist layer through a mask and patterning the electroactive polymer layer;
    forming an upper electrode on the lens actuator; and
    forming a lens unit on the upper electrode to allow light to be transmitted to the image sensor therethrough.

2. The method according to claim 1, further comprising, after forming the upper electrode, forming an adhesive layer on the upper electrode.

3. The method according to claim 1, wherein the preparing of the wafer comprises:
    preparing a wafer including the image sensor and the circuit portion on one side thereof; and
    forming the lower electrode on the wafer.

4. The method according to claim 1, wherein the mask is a graytone mask.

* * * * *